United States Patent
Qiao et al.

(10) Patent No.: US 10,720,524 B1
(45) Date of Patent: Jul. 21, 2020

(54) SPLIT-GATE ENHANCED POWER MOS DEVICE

(71) Applicant: University of Electronic Science and Technology of China, Chengdu (CN)

(72) Inventors: Ming Qiao, Chengdu (CN); Zhengkang Wang, Chengdu (CN); Dong Fang, Chengdu (CN); Ruidi Wang, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/536,333

(22) Filed: Aug. 9, 2019

(30) Foreign Application Priority Data

Mar. 12, 2019 (CN) .......................... 2019 1 0191166

(51) Int. Cl.
*H01L 29/78* (2006.01)
*H01L 29/40* (2006.01)
*H01L 29/423* (2006.01)
*H01L 29/66* (2006.01)

(52) U.S. Cl.
CPC ........ *H01L 29/7813* (2013.01); *H01L 29/407* (2013.01); *H01L 29/42376* (2013.01); *H01L 29/66734* (2013.01)

(58) Field of Classification Search
CPC ........... H01L 29/7813; H01L 29/42376; H01L 29/407; H01L 29/66734
See application file for complete search history.

(56) References Cited

U.S. PATENT DOCUMENTS

| | | | |
|---|---|---|---|
| 5,998,833 A | 12/1999 | Baliga | |
| 6,717,205 B2* | 4/2004 | Gratz | H01L 27/115 257/316 |
| 7,893,486 B2* | 2/2011 | Hirler | H01L 29/404 257/328 |
| 9,818,828 B2* | 11/2017 | West | H01L 29/407 |
| 10,388,783 B2* | 8/2019 | Rankila | H01L 29/42376 |
| 2013/0320435 A1* | 12/2013 | Ng | H01L 29/495 257/330 |
| 2015/0295080 A1* | 10/2015 | Lee | H01L 21/308 257/330 |
| 2017/0148889 A1* | 5/2017 | Chen | H01L 29/66484 |
| 2017/0194485 A1* | 7/2017 | Smith | H01L 29/7813 |

(Continued)

*Primary Examiner* — Victor A Mandala
(74) *Attorney, Agent, or Firm* — Bayramoglu Law Offices LLC (57) ABSTRACT

A split-gate enhanced power MOS device includes a substrate and an epitaxial layer formed on an upper surface of the substrate. A control gate trench is provided in the epitaxial layer. The control gate trench includes a gate electrode and a split-gate electrode. The gate electrode includes a first gate electrode and a second gate electrode. The first gate electrode and the second gate electrode are located in an upper half portion of the control gate trench and are separated by a first dielectric layer. The first gate electrode and the second gate electrode are located above the split-gate electrode and are separated from the split-gate electrode by a second dielectric layer. The first gate electrode and the second gate electrode are separated from a body region in the epitaxial layer by a gate dielectric.

6 Claims, 7 Drawing Sheets

(56) References Cited

U.S. PATENT DOCUMENTS

| | | | |
|---|---|---|---|
| 2017/0236934 A1* | 8/2017 | Rankila | H01L 29/7813 |
| | | | 257/330 |
| 2017/0338309 A1* | 11/2017 | Liu | H01L 29/4983 |
| 2018/0212027 A1* | 7/2018 | Cai | H01L 29/66734 |
| 2018/0315846 A1* | 11/2018 | Bobde | H01L 29/407 |
| 2019/0198676 A1* | 6/2019 | Hsieh | H01L 29/78648 |
| 2019/0237576 A1* | 8/2019 | Qiao | H01L 29/7825 |
| 2020/0105890 A1* | 4/2020 | Tu | H01L 29/401 |

* cited by examiner

SPLIT-GATE ENHANCED POWER MOS DEVICE

CROSS REFERENCE TO THE RELATED APPLICATIONS

This application is based upon and claims priority to Chinese Patent Application No. 201910191166.9, filed on Mar. 12, 2019, the entire contents of which are incorporated herein by reference.

TECHNICAL FIELD

The present invention belongs to the field of power semiconductor devices, and more specifically relates to a split-gate enhanced power MOS device with a low gate charge.

BACKGROUND

Figure 1:
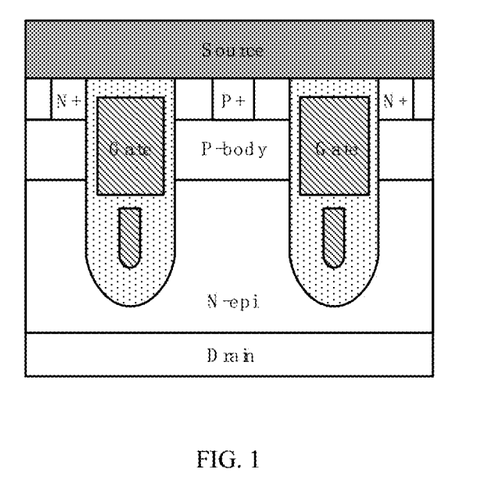
FIG. 1 is a structural diagram of a conventional split-gate deep trench MOS device.

Power management systems require the power semiconductor devices to have low on-resistance and low parasitic capacitance to reduce device conduction losses and switching losses. Power metal oxide semiconductor (MOS) devices are characterized in their gate drive with low power consumption, fast switching speed, easy to be connected in parallel, etc. Owing to these characteristics, the power MOS devices are widely used in the power management systems. B. J. Baliga, in U.S. Pat. No. 5,998,833, reported a structure of a split-gate deep trench MOS device, as shown in FIG. 1. According to the structure disclosed, a split-gate electrode is used to shield the capacitive coupling between the control gate electrode and the epitaxial layer of the device to reduce the gate-to-drain parasitic capacitance $C_{gd}$. The structure of the split-gate deep trench MOS device not only reduces the $C_{gd}$ introduced by the overlap of the gate field plate and the epitaxial layer in the MOS device with step oxide, but also retains the assistant depletion effect on the epitaxial layer from the gate field plate. Therefore, the split-gate deep trench MOS device has a lower gate charge $Q_g$ and no degeneration on the on-resistance $R_{on}$, which is advantageous for improving the switching characteristics and the working efficiency of the power management system. While reducing the gate-to-drain capacitance $C_{gd}$ of the device, the gate field plate connected to the source in the split-gate deep trench MOS device also introduces a parasitic capacitance $C_{gs}$ between the gate and the gate field plate and a parasitic capacitance $C_{ds}$ between the gate field plate and the epitaxial layer, thereby increasing the input capacitance $C_{iss}$ and the output capacitance $C_{oss}$ of the split-gate deep trench MOS device, partially offsetting the advantage of reducing the gate-to-drain capacitance $C_{gd}$ for the split-gate deep trench MOS device.

Therefore, in view of the above problems, it is imperative to reduce the parasitic capacitances $C_{gs}$ and $C_{ds}$ introduced by the gate field plates in the conventional split-gate deep trench MOS devices. The embodiments of the present invention are proposed in response to this situation.

SUMMARY

The present invention provides a novel split-gate enhanced power MOS device for the purpose of reducing the parasitic capacitance $C_{gs}$ between the control gate and the split-gate in the split-gate deep trench MOS device, thereby reducing the gate charge of the device.

In order to achieve the above objective, the technical solution of the present invention is as follows.

A split-gate enhanced power MOS device includes a substrate 140 and an epitaxial layer 108 formed on an upper surface of the substrate 140; a control gate trench 104 is provided in the epitaxial layer 108; the control gate trench 104 includes a gate electrode 105 and a split-gate electrode 106; the gate electrode 105 includes a first gate electrode 105a and a second gate electrode 105b, the first gate electrode 105a and the second gate electrode 105b are located in an upper half portion of the control gate trench 104 and are separated by a first dielectric layer 109; the first gate electrode 105a and the second gate electrode 105b are located above the split-gate electrode 106 and are separated from the split-gate electrode 106 by a second dielectric layer 110; the first gate electrode 105a and the second gate electrode 105b are separated from a body region 225 in the epitaxial layer 108 by a gate dielectric 111; the split-gate electrode 106 is located in a lower half portion of the control gate trench 104 and is separated from the epitaxial layer 108 by a third dielectric layer 107; the third dielectric layer 107 is located in the lower half portion of the control gate trench 104 and covers a sidewall and a bottom of the control gate trench 104; the body region 225 is located on an upper surface of the epitaxial layer 108, and the body region 225 includes a first source 126 and a second source 227; the first dielectric layer 109 is located on upper surfaces of the body region 225 and the control gate trench 104; and a source electrode metal 130 is located on an upper surface of the device, and the source electrode metal connects the first source 126 and the second source 227.

Preferably, the method for manufacturing the split-gate enhanced power MOS device includes the following steps:

1) forming a series of trenches on the epitaxial layer 108 by using a first mask, wherein the series of trenches include the control gate trench 104 in an active region 101 and a hybrid region 103, and the split-gate trench 115 in a termination region 102;

2) forming the split-gate electrode 106 in the lower half portion of the control gate trench 104 of the active region 101 by using a second mask, and forming a complete split-gate electrode 106 in the split-gate trench 115 of the termination region 102 to make an L shape for the split-gate electrode 106 in the control gate trench 104 in the hybrid region 103;

3) forming the second dielectric layer 110 in the active region 101 and the hybrid region 103 by using a third mask, wherein the second dielectric layer 110 in the hybrid region 103 is L-shaped;

4) forming the gate dielectric 111 covering a sidewall in an upper half portion of the control gate trench 104 in the active region 101; then depositing to form the gate electrodes 105 in the active region 101 and the hybrid region 103, wherein the gate electrode 105 in the control gate trench 104 in the active region 101 is U-shaped, and the gate electrode 105 in the control gate trench 104 in the hybrid region 103 is L-shaped;

5) performing a mask-less etching to form the first gate electrode 105a and the second gate electrode 105b covering the sidewall of the upper half portion of the control gate trench 104 in the active region 101 and form the gate electrode 105 covering the sidewall of the upper half portion of the control gate trench 104 in the hybrid region 103;

6) forming the body region 225 on an upper surface of the epitaxial layer 108, and forming the first source 126 in a portion of the body region 225 by using a fourth mask;

7) forming a gate contact and a source contact on the epitaxial layer 108 by using a fifth mask; and 8) depositing metal on the epitaxial layer 108, and forming the source electrode metal 130 in the termination region 102, a portion of the active region 101, and a portion of the hybrid region 103 by using a sixth mask, and forming a gate electrode metal 131 in a portion of the active region 101 and a portion of the hybrid region 103.

Preferably, a second split-gate electrode 136 is provided between the split-gate electrode 106 and the gate electrode 105; the split-gate electrode 106 and the second split-gate electrode 136 are separated by the second dielectric layer 110; the gate electrode 105 and the second split-gate electrode 136 are separated by the second dielectric layer 110; a thickness of the gate dielectric 111 is smaller than a thickness of the second dielectric layer 110 between a left or right side of the second split-gate electrode 136 and the epitaxial layer 108, and the thickness of the second dielectric layer 110 between the left or right side of the second split-gate electrode 136 and the epitaxial layer 108 is smaller than a thickness of the third dielectric layer 107.

Preferably, the bottom of the control gate trench 104 has an assistant depletion region 220; the assistant depletion region 220 has opposite dopant over the epitaxial layer 108.

Preferably, the assistant depletion region 220 is strip-shaped.

Preferably, a current extraction layer 143 is provided between the substrate 140 and the epitaxial layer 108; the substrate 140 has opposite dopant over the epitaxial layer 108, and the substrate 140 has opposite dopant over the current extraction layer 143; a current extraction region 141 is provided on two sides of the epitaxial layer 108, and the current extraction region 141 connects the current extraction layer 143 and a drain electrode metal 142.

The advantages of the present invention are as follows.

The separation of the first gate electrode and the second gate electrode effectively reduces the overlapping area between the gate electrode and the split-gate electrode, while retains the assistant depletion effect on the epitaxial layer from the gate field plate in the conventional split-gate deep trench MOS device, thereby effectively reducing the gate charge of the device while ensuring that there is no degeneration on the on-resistance of the device. The elimination of the split-gate electrode and the second dielectric layer can alleviate the difficulty in manufacturing the devices and lower the manufacturing cost. In addition, the introduction of the assistant depletion region at the bottom of the control gate trench can further reduce the specific on-resistance of the devices.

Reference numerals in the drawings are described below: 100—split-gate enhanced power MOS device, 101—active region, 102—termination region, 103—hybrid region, 104—control gate trench, 105—gate electrode, 105a—first gate electrode, 105b—second gate electrode, 106—split-gate electrode, 107—third dielectric layer, 108—epitaxial layer, 109—first dielectric layer, 110—second dielectric layer, 111—gate dielectric, 115—split-gate trench, 120—hard mask, 126—first source, 130—source electrode metal, 131—gate electrode metal, 136—second split-gate electrode, 140—substrate, 141—current extraction region, 142—drain electrode metal, 143—current extraction layer, 220—assistant depletion region, 225—body region, 227—second source, 155—first hard mask oxide layer, 116—nitride, and 117—second hard mask oxide layer.

DETAILED DESCRIPTION OF THE EMBODIMENTS

The implementations of the present invention are described below by specific embodiments, and those skilled in the art can readily understand other advantages and effects of the present invention from the disclosure of the present specification. The present invention may further be implemented or applied in various other specific embodiments, and all the details in the present specification may further be modified or changed without departing from the spirit of the present invention according to different perspectives and applications.

FIG. 1 is a structural diagram of a conventional split-gate deep trench MOS device having an epitaxial layer on the upper surface of the drain and a body region on the upper surface of the epitaxial layer. The deep trench penetrates the body region of the device and extends into the interior of the epitaxial layer. The control gate is located in the upper half portion of the deep trench, the split-gate is located in the lower half portion of the deep trench, and the control gate and the split-gate are separated by a dielectric layer. When a positive voltage is applied to the control gate of the device and the voltage is equal to the threshold voltage, the current between the drain and source increases significantly and the device begins to conduct. On one hand, the introduction of the split-gate in the deep trench can reduce the capacitive coupling between the control gate and the epitaxial layer of the device, thereby significantly reducing the gate-to-drain capacitance $C_{gd}$ of the device. On the other hand, split gate assists in depleting epitaxial layer at device reverse blocking mode. On the other hand, the epitaxial layer can be depleted with the assistant of the split-gate when a reverse voltage is applied on the device, resulting in a higher doping concentration of the epitaxial layer, and the specific on-resistance of the device can be further reduced. However, the split-gate electrode, in turn, also introduces parasitic $C_{GS}$ and $C_{DS}$, which partially offsets the advantage of reducing the gate-to-drain capacitance $C_{gd}$ for the split-gate deep trench MOS device.

Embodiment 1

Figure 2:
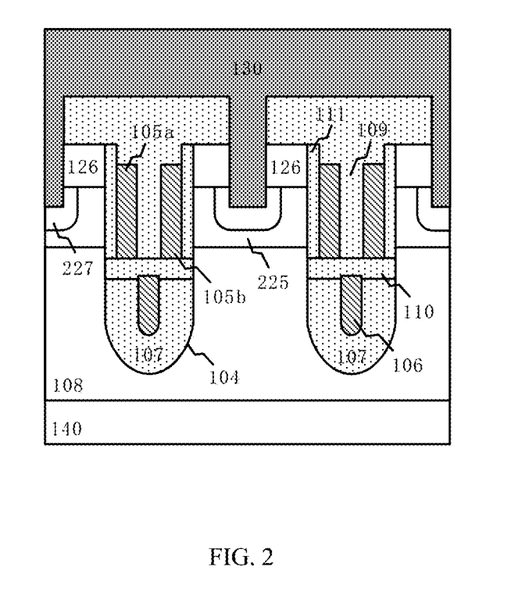
FIG. 2 is a cross-sectional structural diagram of a cell of a split-gate enhanced power MOS device according to the present invention.

FIG. 2 is a cross-sectional structural diagram of a cell of a split-gate enhanced power MOS device according to this embodiment. The split-gate enhanced power MOS device includes the substrate 140 and the epitaxial layer 108 formed on an upper surface of the substrate 140. The control gate trench 104 is provided in the epitaxial layer 108. The control gate trench 104 includes the gate electrode 105 and the split-gate electrode 106. The gate electrode 105 includes the first gate electrode 105a and the second gate electrode 105b. The first gate electrode 105a and the second gate electrode 105b are located in an upper half portion of the control gate trench 104 and are separated by the first dielectric layer 109. The first gate electrode 105a and the second gate electrode 105b are located above the split-gate electrode 106 and are separated from the split-gate electrode 106 by the second dielectric layer 110. The first gate electrode 105a and the second gate electrode 105b are separated from the body region 225 in the epitaxial layer 108 by the gate dielectric 111. The split-gate electrode 106 is located in a lower half portion of the control gate trench 104 and is separated from the epitaxial layer 108 by the third dielectric layer 107. The third dielectric layer 107 is located in the lower half portion of the control gate trench 104 and covers a sidewall and a bottom of the control gate trench 104. The body region 225 is arranged on an upper surface of the epitaxial layer 108, and the body region 225 includes the first source 126 and the second source 227. The first dielectric layer 109 is located on upper surfaces of the body region 225 and the control gate trench 104. The source electrode metal 130 is located on an upper surface of the device, and the source electrode metal 130 connects the first source 126 and the second source 227.

Figure 3A:
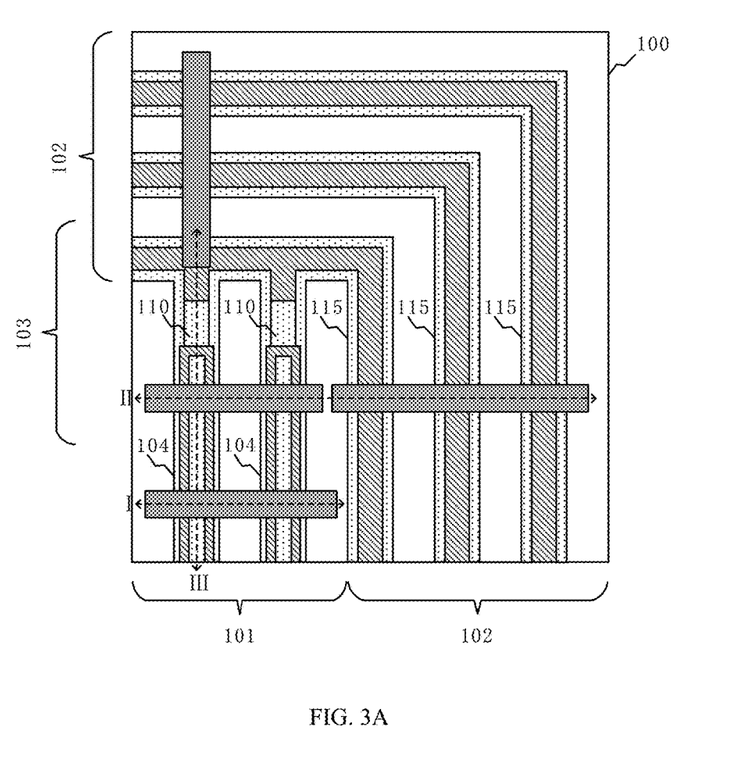
FIG. 3A is a partial top view of the split-gate enhanced power MOS device of FIG. 2.

FIG. 3A is a partial top view of the split-gate enhanced power MOS device of FIG. 2. As shown in the drawing, the split-gate enhanced power MOS device 100 includes the active region 101, the termination region 102, and the hybrid region 103. The control gate trench 104 is provided in the active region 101, and the split-gate trench 115 is provided in the termination region 102. The second dielectric layer 110 is provided in the hybrid region 103, and the second dielectric layer 110 separates the active region 101 from the termination region 102.

Figure 3B:
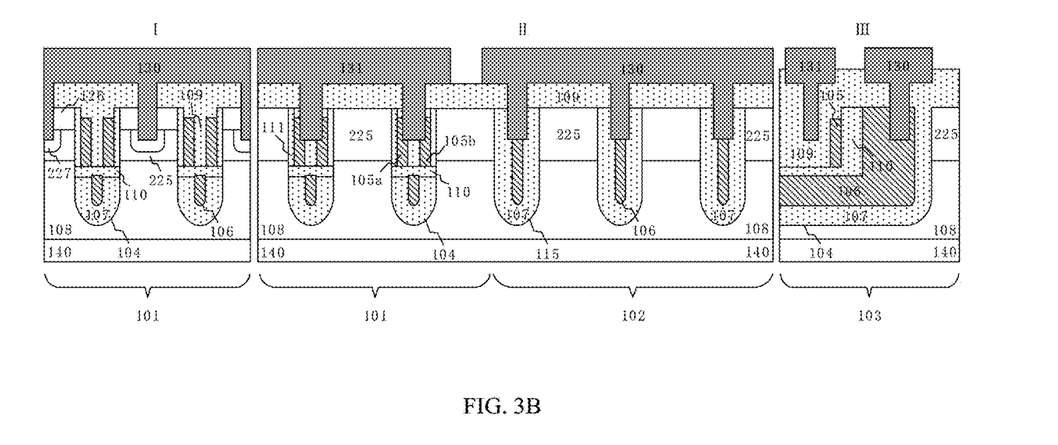
FIG. 3B is a cross-sectional structural view of the split-gate enhanced power MOS device of FIG. 3A taken on straight lines I, II, and III.

FIG. 3B is a cross-sectional structural view of the split-gate enhanced power MOS device of FIG. 3A taken on lines I, II, and III. The epitaxial layer 108 is provided on an upper surface of the substrate 140. The active region 101 is provided on the upper surface of the epitaxial layer 108, and the control gate trench 104 is provided in the active region 101. The control gate trench 104 includes the gate electrode 105 and the split-gate electrode 106. The gate electrode 105 includes the first gate electrode 105a and the second gate electrode 105b. The first gate electrode 105a and the second gate electrode 105b are located in an upper half portion of the control gate trench 104 and are separated by the first dielectric layer 109. The first gate electrode 105a and the second gate electrode 105b are located above the split-gate electrode 106 and are electrically isolated by the second dielectric layer 110. The first gate electrode 105a and the second gate electrode 105b are separated from the body region 225 in the epitaxial layer 108 by the gate dielectric 111. The split-gate electrode 106 is located in a lower half portion of the control gate trench 104 and is separated from the epitaxial layer 108 by the third dielectric layer 107. The third dielectric layer 107 is located in the lower half portion of the control gate trench 104 and covers the sidewall and the bottom of the control gate trench 104. The upper surface of the active region 101 includes the body region 225, and the body region 225 includes the first source 126 and the second source 227. The first dielectric layer 109 is located on the upper surfaces of the body region 225 and the control gate trench 104. The source electrode metal 130 covers an upper surface of the active region 101, and connects the first source 126 and the second source 227. The gate electrode metal 131 covers the upper surface of the active region 101, and connects the first gate electrode 105a and the second gate electrode 105b.

The upper surface of the epitaxial layer 108 is provided with the termination region 102, and the termination region 102 includes the split-gate trench 115. The split-gate electrode 106 is located inside the split-gate trench 115 and is electrically isolated from the epitaxial layer 108 by the third dielectric layer 107. The upper half portion of the epitaxial layer 108 includes the body region 225. The first dielectric layer 109 is located on upper surfaces of the body region 225 and the split-gate trench 115. The source electrode metal 130 covers the upper surface of the epitaxial layer 108, and the source electrode metal 130 is connected to the split-gate electrode 106 inside the split-gate trench 115.

The upper surface of the epitaxial layer 108 is provided with the hybrid region 103, and the hybrid region 103 includes the control gate trench 104. The third dielectric layer 107 covers the sidewall and the bottom of the control gate trench 104. The control gate trench 104 includes the gate electrode 105 and the split-gate electrode 106, and the split-gate electrode 106 is L-shaped. The third dielectric layer 107 separates the split-gate electrode 106 from the epitaxial layer 108, and the gate electrode 105 is separated from the split-gate electrode 106 by the second dielectric layer 110. The upper half portion of the epitaxial layer 108 includes the body region 225. The first dielectric layer 109 is provided on the upper surfaces of the body region 225 and the split-gate trench 115. The source electrode metal 130 covers the upper surface of the epitaxial layer 108, and the source electrode metal 130 is connected to the split-gate electrode 106 inside the control gate trench 104. The gate electrode metal 131 is located on the upper surface of the epitaxial layer 108, and the gate electrode metal 131 is connected to the gate electrode 105.

FIGS. 4A-4F are cross-sectional structural views showing a process flow of the split-gate enhanced power MOS device of FIG. 3A taken on lines I, II, and III. The split-gate enhanced power MOS device is N-type. In some embodiments, a P-type device can be realized by a similar manufacturing process as well.

Figure 4A:
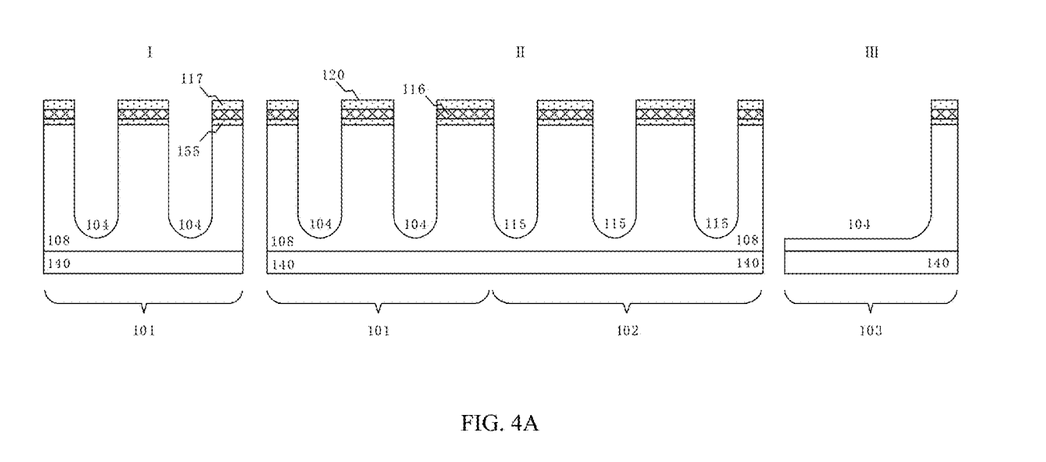
FIGS. 4A-4F are cross-sectional structural views showing a process flow of the split-gate enhanced power MOS device of FIG. 3A taken on straight lines I, II, and III.

In FIG. 4A, the N-type substrate 140 is used as the drain of the split-gate enhanced power MOS device. In some embodiments, the doping concentration of the substrate 140 may be $1\times10^{18}$ cm$^{-3}$ to $1\times10^{20}$ cm$^{-3}$. The upper surface of the substrate 140 is provided with the epitaxial layer 108. In some embodiments, the epitaxial layer 108 may be N-type, having a thickness of 3 μm, and a doping concentration may be $1\times10^{16}$ cm$^{-3}$ to $1\times10^{17}$ cm$^{-3}$. The first hard mask oxide layer 155 is provided on the upper surface of the N-type epitaxial layer. In some embodiments, the first hard mask oxide layer 155 may be formed by thermal oxidation and may have a thickness of 100 Å to 400 Å. The nitride 116 is provided on the upper surface of the first hard mask oxide layer 155. In some embodiments, the nitride 116 has a thickness of 1000 Å to 3000 Å. A second hard mask oxide layer 117 is provided on the upper surface of the nitride 116. In some embodiments, the second hard mask oxide layer 117 having a thickness ranging from 4000 Å to 6000 Å may be formed by oxide deposition. The hard mask 120 consists of the first hard mask oxide layer 155, the nitride 116, and the second hard mask oxide layer 117 arranged from bottom to top, and the hard mask 120 may be used as a mask for etching in a subsequent process. After the second hard mask oxide layer 117 is formed, a photoresist layer is deposited on the entire second hard mask oxide layer 117. Then, a first mask is used to open an opening on the photoresist layer and sequentially etch the second hard mask oxide layer 117, the nitride 116, the first hard mask oxide layer 155, and the epitaxial layer 108. After the epitaxial layer 108 is etched, the control gate trench 104 is formed in the active region 101 and the hybrid region 103, and the split-gate trench 115 is formed in the termination region 102. In some embodiments, the control gate trench 104 and the split-gate trench 115 may have a depth ranging from 1.5 μm to 3 μm and a width ranging from 0.4 μm to 1 μm.

Figure 4B:
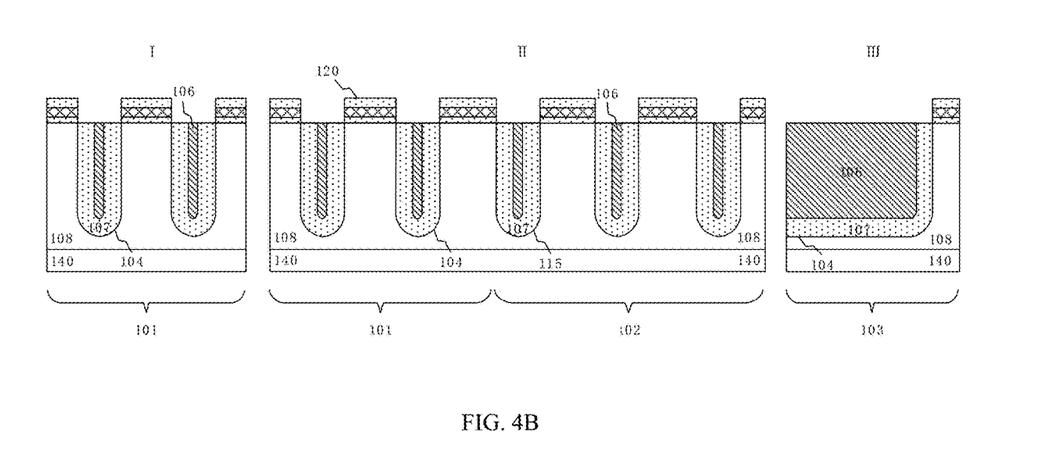

In FIG. 4B, the third dielectric layer 107 is formed in the control gate trench 104 and the split-gate trench 115 by thermal oxidation. The third dielectric layer 107 covers the bottoms and side walls of the control gate trench 104 and the split-gate trench 115, and strip-shaped gaps are formed inside the trenches. In some embodiments, the third dielectric layer 107 may have a thickness ranging from 500 Å to 1500 Å. Subsequently, an N-type conductive material, such as polysilicon, is deposited in the control gate trench 104 and the split-gate trench 115. The polysilicon fills the trenches and covers the hard mask 120 on the upper surface of the epitaxial layer 108. In some embodiments, the deposited polysilicon may have a thickness ranging from 5000 Å to 8000 Å. A chemical mechanical polishing (CMP) is performed to remove the polysilicon on the hard mask 120, and the polysilicon is further etched to only maintain the polysilicon in the control gate trench 104 and the split-gate trench 115, thus forming the split-gate electrode 106. In some embodiments, the upper surface of the split-gate electrode 106 ultimately can stop at the upper surface of the epitaxial layer 108.

Figure 4C:
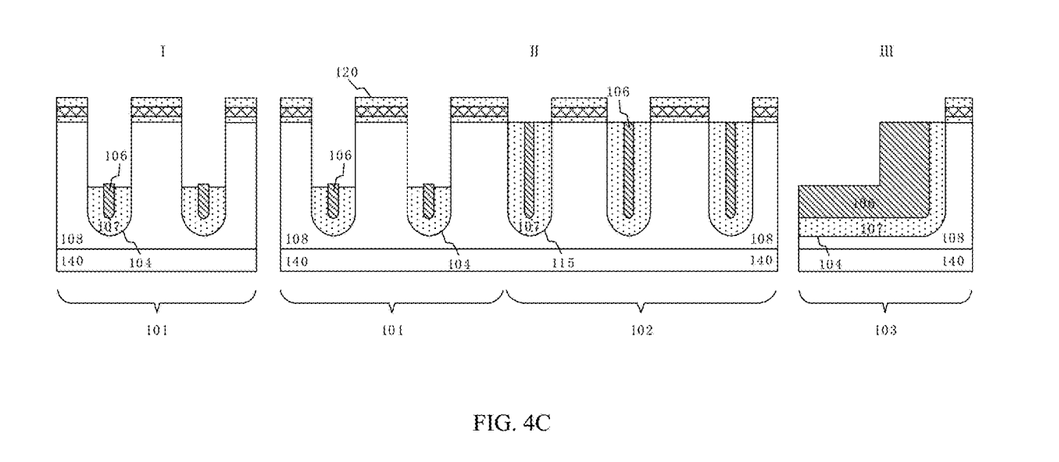

In FIG. 4C, the deposited photoresist covers over the upper surfaces of the entire epitaxial layer 108 and the hard mask 120. A second mask is then used to open an opening on the photoresist layer so that the photoresist covers the termination region 102 and a partial portion of the hybrid region 103 to expose the part of the control gate trench 104 in the active region 101 and the hybrid region 103. The photoresist is provided to allow the split-gate electrode 106 and the third dielectric layer 107 in the termination region 102 and a part of the hybrid region 103 to be free of etching. The split-gate electrode 106 in the control gate trench 104 is etched to form the split-gate electrode 106 located in the lower half portion of the control gate trench 104 in the active region 101, and the L-shaped split gate electrode 106 in the hybrid region 103. In some embodiments, the upper surface of the split-gate electrode 106 ultimately left in the control gate trench 104 may be 0.5 μm to 1 μm lower than the upper surface of the epitaxial layer 108. The photoresist on the termination region 102 and a part of the hybrid region 103 is removed. The third dielectric layer 107 in the upper half portion of the control gate trench 104 in the active region 101 is removed by isotropic etching, so as to expose the epitaxial layer 108 on the sidewall of the control gate trench 104 to get prepared for the manufacturing of the gate dielectric 111 in the follow-up steps. In some embodiments, the third dielectric layer 107 may be isotropic etched by a thickness ranging from 1000 Å to 1500 Å.

Figure 4D:
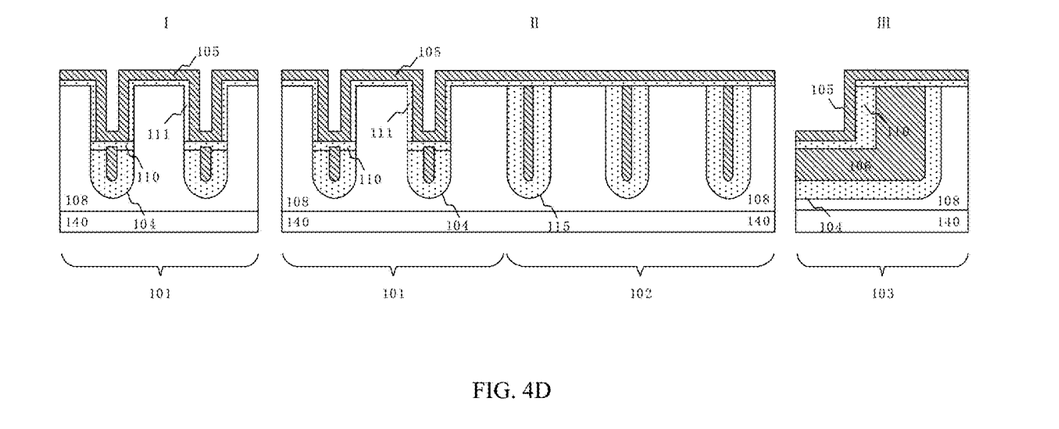

In FIG. 4D, the second dielectric layer 110 is deposited on the upper surfaces of the active region 101, the termination region 102, and the hybrid region 103. In some embodiments, the second dielectric layer 110 may be an oxide deposited with a thickness ranging from 10,000 Å to 30,000 Å. The deposited second dielectric layer 110 is polished by CMP to completely remove the second hard mask oxide layer 117 and the second dielectric layer 110 over the nitride 116. Then, the nitride 116 and the first hard mask oxide layer 155 are removed and the second dielectric layer 110 is etched. In some embodiments, after the second dielectric layer 110 is etched, the upper surface of the second dielectric layer 110 may be flushed with the epitaxial layer 108. The photoresist is deposited to cover the upper surface of the epitaxial layer 108. After that, a third mask is used to open the opening on the photoresist, causing the photoresist to cover the termination region 102 and a part of the hybrid region 103, so as to expose the control gate trench 104 in the active region 101 and a part of the second dielectric layer 110 in the hybrid region 103. The second dielectric layer 110 in the active region 101 and a part of the hybrid region 103 is then etched, thus the second dielectric layer 110 left in the hybrid region 103 is L-shaped. In some embodiments, the second dielectric layers 110 left in the active region 101 and a part of the hybrid region 103 has a thickness ranging from 1000 Å to 2000 Å. The photoresist is removed, and the gate dielectric 111 is prepared, so that the gate dielectric 111 covers the sidewalls of the upper half portion of the control gate trench 104 in a part of the hybrid region 103 and the active region 101. In some embodiments, the gate dielectric 111 may be an oxide formed by thermal oxidation and may have a thickness ranging from 200 Å to 600 Å. Next, the gate electrode 105 is deposited in the active region 101, the termination region 102, and the hybrid region 103, so that the gate electrode 105 covers the upper surface of the second dielectric layer 110 in the control gate trench 104 and the surface of the gate dielectric 111 on the sidewalls, and the gate electrode 105 in the control gate trench 104 is U-shaped. Meanwhile, the gate electrode 105 is located on the upper surface of the epitaxial layer 108. In some embodiments, the deposited gate electrode 105 may be N-type polysilicon, and the deposited polysilicon may have a thickness ranging from 500 Å to 2000 Å.

Figure 4E:
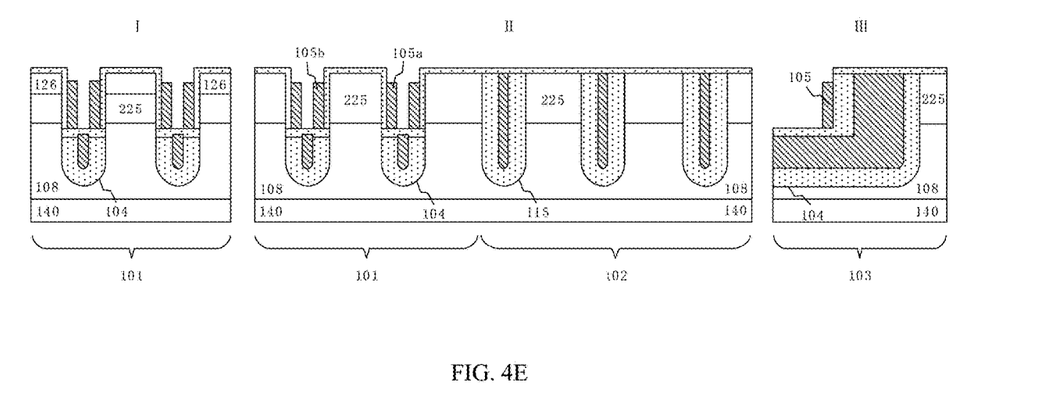

In FIG. 4E, the deposited polysilicon is etched to form the first gate electrode 105a and the second gate electrode 105b covering the sidewall of the upper half portion of the control gate trench 104 in the active region 101, and to form the gate electrode 105 covering the sidewall of the upper half portion of the control gate trench 104 in the hybrid region 103, without using a mask. In some embodiments, the etched polysilicon may have a thickness ranging from 1500 Å to 3000 Å, and the upper surfaces of the first gate electrode 105a, the second gate electrode 105b, and the gate electrode 105 may be 0.1 μm away from the upper surface of the epitaxial layer 108. After that, an oxide layer is formed by thermal oxidation followed by the implantation of the impurity in the body region and drive-in to form the body region 225. In some embodiments, the split-gate enhanced power MOS device 100 is N-type, the P-type impurities implanted in the body region may be boron, and the body region 225 after drive-in may have a depth of 0.5 μm. After the formation of the body region 225, the photoresist is deposited to cover the entire epitaxial layer 108. Then, the fourth mask is used to open an opening on the photoresist, causing the photoresist to cover the termination region 102 and a part of the hybrid region 103, and a part of the active region 101 is exposed. Next, impurities are implanted into the body region 225 to form the first source 126. In some embodiments, the split-gate enhanced power MOS device 100 is N-type, the implanted N-type impurities may be arsenic, and the first source 126 formed after the implantation may have a depth of 0.3 μm.

Figure 4F:
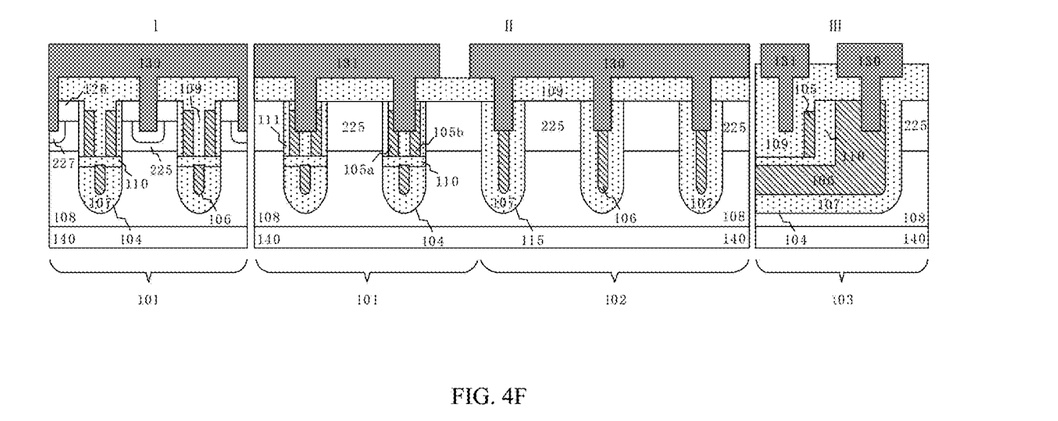

In FIG. 4F, after the body region 225 and the first source 126 are formed, the first dielectric layer 109 is deposited to fill the gap between the first gate electrode 105a and the second gate electrode 105b, and to fill the control gate trench 104 in the hybrid region 103. In some embodiments, the filled first dielectric layer 109 may be undoped silicon glass (USG), boro-phospho-silicate glass (BPSG), silicon dioxide, or a combination of the above materials. The CMP polishing is performed after the deposition of the first dielectric layer 109. The fifth mask is used to etch the first dielectric layer 109, a part of the first source 126 and the body region 225 in the active region 101, and a part of the first gate electrode 105a and the second gate electrode 105b in the active region 101. Simultaneously, the split-gate electrode 106 in the termination region 102 is etched. After the photoresist is removed, the impurities are implanted to form the second source 227 in a part of the active region 101. In some embodiments, the implanted impurities maybe boron. Finally, a conductive material is filled in the opening, followed by depositing metal and etching by using the sixth mask to form the source electrode metal 130 and the gate electrode metal 131. In some embodiments, the filled conductive material may be tungsten and the deposited metal may be aluminum. Subsequently, the standard vertical double-diffused metal oxide semiconductor (VDMOS) process is performed to complete the process flow.

According to the main manufacturing process of the split-gate enhanced power MOS device provided above, the separated first gate electrode 105a and second gate electrode 105b may be formed in the same process without using an additional mask. In addition, the separated first gate electrode 105a and second gate electrode 105b may also be produced by other manufacturing processes. As in the process shown in FIG. 4D, the gate electrode 105 is deposited in the active region 101, the termination region 102 and the hybrid region 103, so that the gate electrode 105 fills up the control gate trench 104. Next, the gate electrode 105 is polished by the CMP, and etched once again so that the upper surface of the gate electrode 105 in the control gate trench 104 is lower than the upper surface of the epitaxial layer 108. In some embodiments, the distance between the upper surface of the gate electrode 105 and the upper surface of the epitaxial layer 108 may be 0.1 μm. Finally, a mask is used to open an opening in the middle of the upper surface of the gate electrode 105 in the control gate trench 104, and then the middle portion of the gate electrode 105 is etched, thus obtaining the separated first gate electrode 105a and second gate electrode 105b in the active region 101. However, the above method has two drawbacks. First, applying an additional mask increases the manufacturing cost. Second, the control gate trench 104 of a small width requires a much smaller opening on the upper surface of the gate electrode 105 to form the separated first gate electrode 105a and second gate electrode 105b. These will be challenging for the manufacturing process, i.e., the process cannot realize an extremely narrow polysilicon trench. Secondly, it is inconvenient to fill the extremely narrow polysilicon trench with dielectric material in the follow-up process, and tends to introduce voids, which may lead to degeneration of device performance.

Table 1 compares the process simulation results of the conventional split-gate deep trench MOS device shown in FIG. 1 and the split-gate enhanced power MOS device provided in FIG. 2. The two N-type MOS devices both have a breakdown voltage of 25 V. The main process conditions are as follows. The resistivity of the N-type substrate is 0.0012 Ω·cm, the cell pitch is 1.35 μm, the trench depth and the trench width are 2.2 μm and 0.45 μm respectively, the thickness of the N-type epitaxial layer is 3.2 μm, and the resistivity of the epitaxial layer is 0.18 Ω·cm. Moreover, in the process of preparing the first gate electrode 105a and the second gate electrode 105b of the split-gate enhanced power MOS device, the thickness of the deposited polysilicon is 0.1 μm, and then 0.3-μm-thickness polysilicon in trench is etched away. The simulation results show that the two devices have essentially the same breakdown voltage VB and threshold voltage $V_{TH}$. For the total gate charge $Q_G$ and gate-to-drain charge $Q_{GD}$, the split-gate enhanced power MOS device shows approximately 31% and 29% improvements over the conventional split-gate deep trench MOS device. In addition, the device figures of merit, i.e. $Q_G \times R_{ON,SP}$ and $Q_{GD} \times R_{ON,SP}$, are reduced by about 28% and 27% over the conventional device. It should be noted that the $R_{ON,SP}$ of the split-gate enhanced power MOS device increases slightly over the conventional device, because majority carrier accumulation effect of the separated first gate electrode 105a and second gate electrode 105b in the epitaxial layer is weaker than that of the conventional structure.

TABLE 1

| Performance Parameter | Device shown in FIG. 1 | Device shown in FIG. 2 |
| --- | --- | --- |
| $V_B$ (V) | 33.9 | 34.3 |
| $V_T$ (V) | 1.81 | 1.65 |
| $R_{ON,SP}$ (mΩ · mm$^2$) | 3.95 | 4.08 |
| $Q_G$ (nC/mm$^2$) | 6.07 | 4.21 |
| $Q_G \times R_{ON,SP}$ (nC · mΩ) | 23.9 | 17.16 |
| $Q_{GD}$ (nC/mm$^2$) | 2.37 | 1.68 |
| QGD × $R_{ON,SP}$ (nC · mΩ) | 9.36 | 6.85 |

Embodiment 2

Figure 5:
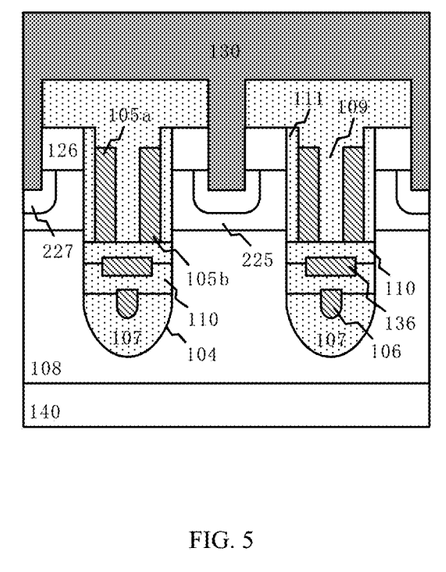
FIG. 5 is a schematic diagram of a split-gate enhanced power MOS device having a second split-gate electrode according to embodiment 2 of the present invention.

The present embodiment differs with embodiment 1 in that the second split-gate electrode 136 is provided between the split-gate electrode 106 and the gate electrode 105. The split-gate electrode 106 and the second split-gate electrode 136 are separated by the second dielectric layer 110. The gate electrode 105 and the second split-gate electrode 136 are separated by the second dielectric layer 110. In this embodiment, the thickness of the gate dielectric 111 is less than the thickness of the second dielectric layer 110 between the left or right side of the second split-gate electrode 136 and the epitaxial layer 108. The thickness of the second dielectric layer 110 between the left or right side of the second split-gate electrode 136 and the epitaxial layer 108 is less than the thickness of the third dielectric layer 107. When a reverse voltage is applied to the device, the vertical electric field at epitaxial layer 108/control gate trench 104 interface is more uniform, and the breakdown voltage is higher than that of the device in embodiment 1.

Embodiment 3

Figure 6:
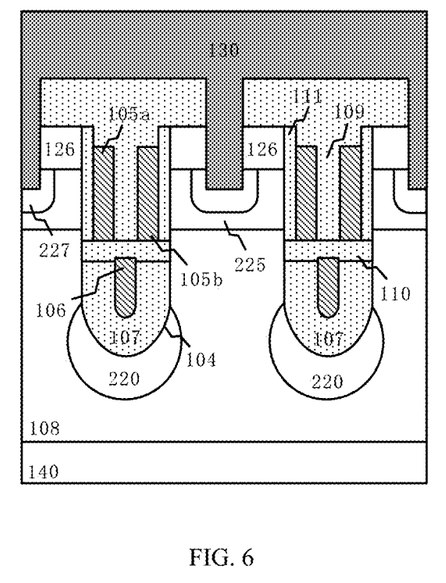
FIG. 6 is a schematic diagram of a split-gate enhanced power MOS device having an assistant depletion region in an epitaxial layer according to embodiment 3 of the present invention.

The present embodiment differs with embodiment 1 in that after the epitaxial layer 108 is etched to form the control gate trench 104, the assistant depletion region 220 is formed at the bottom of the control gate trench 104 by ion implantation. The assistant depletion region 220 has opposite dopant over the epitaxial layer 108, which can deplete the epitaxial layer when a reverse voltage is applied to the device. Therefore, in this embodiment, the impurity concentration of the epitaxial layer 108 can be higher, and the device has a lower specific on-resistance over embodiment 1.

Embodiment 4

Figure 7:
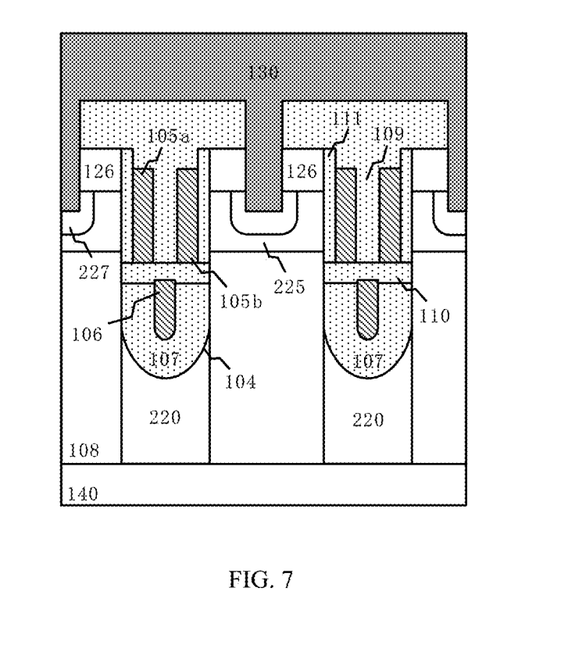
FIG. 7 is a schematic diagram of a split-gate enhanced power MOS device having a strip-shaped assistant depletion region in an epitaxial layer according to embodiment 4 of the present invention.

The present embodiment differs with embodiment 3 in that the strip-shaped assistant depletion region 220 is provided between the bottom of the control gate trench 104 and the substrate 140. The strip-shaped assistant depletion region 220 can be formed by either trench etching followed by trench filling, or multiple epitaxies and ion implantations. The strip-shaped assistant depletion region 220 makes the vertical electric field distribution of the device more uniform, increases the impurity concentration of the epitaxial layer 108, and lowers the specific on-resistance of the device.

Embodiment 5

Figure 8:
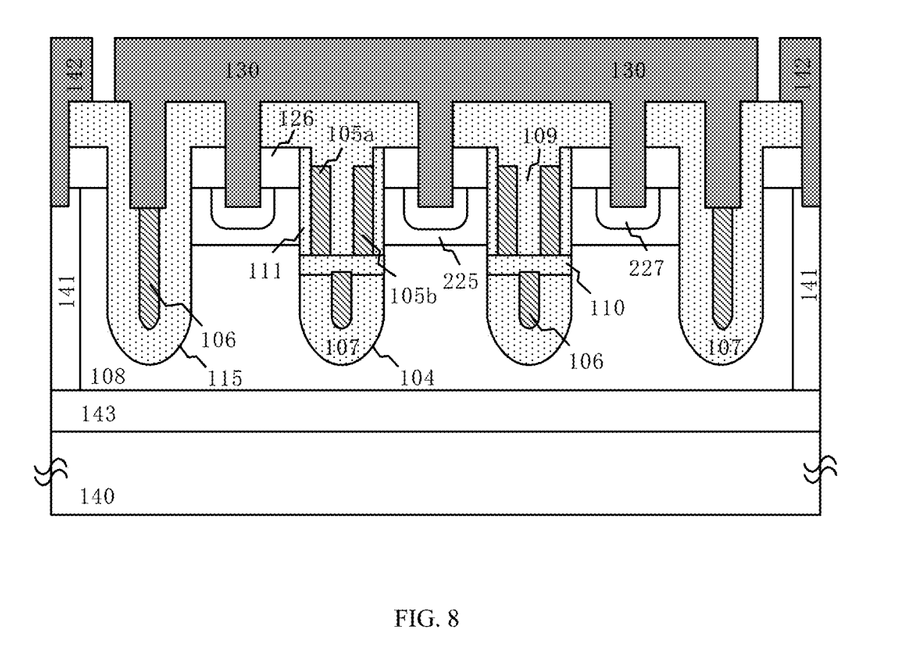
FIG. 8 is a schematic diagram of an integrated lateral split-gate enhanced power MOS device according to embodiment 5 of the present invention.

The present embodiment differs with embodiment 1 in that the current extraction layer 143 is provided between the substrate 140 and the epitaxial layer 108. The substrate 140 has opposite dopant over the epitaxial layer 108, and the substrate 140 also has opposite dopant over the current extraction layer 143. The current extraction region 141 is provided on a left and right side of the epitaxial layer 108, and the current extraction region 141 connects the current extraction layer 143 and the drain electrode metal 142. In this embodiment, the electrodes of the device are all located on the surface of the device, which is more convenient to integrate with other types of devices as compared to the device in embodiment 1.

The above embodiments are merely provided to demonstrate the principle and effect of the present invention rather than limiting the present invention. Those skilled in the art may modify or change the embodiments without departing from the spirit and scope of the present invention. Therefore, any equivalent modification or change derived from those of ordinary skill in the art without departing from the spirit and technical thought disclosed in the present invention should still be considered as falling within the scope of the present invention.

What is claimed is:

1. A split-gate enhanced power MOS device, comprising: a substrate and an epitaxial layer formed on an upper surface of the substrate;
wherein, a control gate trench is provided in the epitaxial layer; the control gate trench comprises a plurality of gate electrodes and a split-gate electrode; the plurality of gate electrodes comprises a first gate electrode and a second gate electrode, the first gate electrode and the second gate electrode are located in an upper half portion of the control gate trench and are separated by a first dielectric layer; the first gate electrode and the second gate electrode are located above the split-gate electrode and are separated from the split-gate electrode by a second dielectric layer; the first gate electrode and the second gate electrode are separated from a body region in the epitaxial layer by a gate dielectric; the split-gate electrode is located in a lower half portion of the control gate trench and is separated from the epitaxial layer by a third dielectric layer; the third dielectric layer is located in the lower half portion of the control gate trench and covers a sidewall and a bottom of the control gate trench; the body region is located on an upper surface of the epitaxial layer, and the body region is provided with a first source and a second source; the first dielectric layer is located on upper surfaces of the body region and the control gate trench; a source electrode metal is located on an upper surface of the device, and the source electrode metal connects the first source and the second source.

2. A method for manufacturing the split-gate enhanced power MOS device of claim 1, comprising the following steps:
1) forming a series of trenches on the epitaxial layer by using a first mask, the series of trenches comprise the control gate trench in an active region and a hybrid region, and the split-gate trench in a termination region;
2) forming the split-gate electrode in the lower half portion of the control gate trench in the active region by using a second mask, and forming split-gate electrode completely in the split-gate trench in the termination region to make an L-shaped split-gate electrode in the control gate trench in the hybrid region;
3) forming the second dielectric layer in the active region and the hybrid region by using a third mask, wherein the second dielectric layer in the hybrid region is L-shaped;
4) forming the gate dielectric covering a sidewall in the upper half portion of the control gate trench in the active region; then depositing the plurality of gate electrodes in the active region and the hybrid region, wherein a U-shaped gate electrode is deposited in the control gate trench in the active region, and a L-shaped gate electrode is deposited in the control gate trench in the hybrid region;
5) performing a mask-less etching to form the first gate electrode and the second gate electrode covering the sidewall of the upper half portion of the control gate trench in the active region and form the L-shaped gate electrode covering the sidewall of the upper half portion of the control gate trench in the hybrid region;
6) forming the body region on an upper surface of the epitaxial layer, and forming the first source in a part of the body region by using a fourth mask;
7) forming a gate contact and a source contact on the epitaxial layer by using a fifth mask; and
8) depositing metal on the epitaxial layer, and forming a source electrode metal in the termination region, a part of the active region, and a part of the hybrid region by using a sixth mask, and forming a gate electrode metal in a part of the active region and a part of the hybrid region.

3. The split-gate enhanced power MOS device of claim 1, wherein, a second split-gate electrode is provided between the split-gate electrode and the gate electrode; the split-gate electrode and the second split-gate electrode are separated by the second dielectric layer; the gate electrode and the second split-gate electrode are separated by the second dielectric layer; a thickness of the gate dielectric is smaller than a thickness of the second dielectric layer between a left or right side of the second split-gate electrode and the epitaxial layer, and a thickness of the second dielectric layer between the left or right side of the second split-gate electrode and the epitaxial layer is smaller than a thickness of the third dielectric layer.

4. The split-gate enhanced power MOS device of claim 1, wherein, the bottom of the control gate trench has an assistant depletion region; and the assistant depletion region has an opposite dopant over the epitaxial layer.

5. The split-gate enhanced power MOS device of claim 4, wherein, the assistant depletion region is strip-shaped.

6. The split-gate enhanced power MOS device of claim 1, wherein, a current extraction layer is provided between the substrate and the epitaxial layer; the substrate has an opposite dopant over the epitaxial layer, and the substrate has an opposite dopant over the current extraction layer; a current extraction region is provided on a left and right side of the epitaxial layer, and the current extraction region connects the current extraction layer and a drain electrode metal.

* * * * *